US012804909B2

(12) United States Patent
Hou et al.

(10) Patent No.: US 12,804,909 B2
(45) Date of Patent: Nov. 17, 2026

(54) EMBEDDED MEMORY DEVICE AND FABRICATION METHOD THEREOF

(71) Applicant: UNITED MICROELECTRONICS CORP., Hsin-Chu City (TW)

(72) Inventors: Tai-Cheng Hou, Tainan (TW); Da-Jun Lin, Kaohsiung (TW); Fu-Yu Tsai, Tainan (TW); Bin-Siang Tsai, Changhua County (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 370 days.

(21) Appl. No.: 18/593,971

(22) Filed: Mar. 3, 2024

(65) Prior Publication Data

US 2025/0248048 A1 Jul. 31, 2025

(30) Foreign Application Priority Data

Jan. 30, 2024 (CN) ......................... 202410129188.3

(51) Int. Cl.

| | |
|---|---|
| ***H10B 61/00*** | (2023.01) |
| ***H10D 1/68*** | (2025.01) |
| ***H10N 50/01*** | (2023.01) |
| ***H10N 50/10*** | (2023.01) |
| ***H10W 20/41*** | (2026.01) |
| ***H10W 20/42*** | (2026.01) |

(52) U.S. Cl.

CPC ............. *H10B 61/20* (2023.02); *H10D 1/696* (2025.01); *H10N 50/01* (2023.02); *H10N 50/10* (2023.02); *H10W 20/42* (2026.01); *H10W 20/435* (2026.01); *H10B 61/10* (2023.02)

(58) Field of Classification Search

CPC .. H10N 50/00–85; H10B 61/10; H10B 61/20; H10B 61/22; H10D 1/60; H10D 1/62; H10D 1/665; H10D 1/692; H10D 1/696

See application file for complete search history.

(56) References Cited

U.S. PATENT DOCUMENTS

| | | | | |
|---|---|---|---|---|
| 7,250,334 | B2 | 7/2007 | Crenshaw | |
| 2003/0156378 | A1 | 8/2003 | Chiang | |
| 2021/0399207 | A1* | 12/2021 | Wang | H10B 61/22 |
| 2022/0406994 | A1* | 12/2022 | Lin | H10B 61/00 |
| 2023/0102165 | A1* | 3/2023 | Dutta | H10B 61/00 257/427 |

* cited by examiner

*Primary Examiner* — Julio J Maldonado
*Assistant Examiner* — Pinaki Das
(74) *Attorney, Agent, or Firm* — Winston Hsu

(57) ABSTRACT

An embedded memory device includes a substrate having an embedded memory region thereon; a first dielectric layer disposed on the substrate within the embedded memory region; conductive vias embedded in the first dielectric layer; data storage structures respectively disposed on the conductive vias; and spacers respectively surrounding the data storage structures over the first dielectric layer. An outer surface of the spacers and a top surface of the first dielectric layer between the spacers constitute a recessed region. A metal-insulator-metal (MIM) capacitor structure is disposed within the recessed region.

20 Claims, 5 Drawing Sheets

EMBEDDED MEMORY DEVICE AND FABRICATION METHOD THEREOF

BACKGROUND OF THE INVENTION

1. Field of the Invention

The present invention relates to the field of semiconductor technology, and in particular to an improved embedded memory device and a manufacturing method thereof.

2. Description of the Prior Art

Magnetoresistive Random Access Memory (MRAM) is a non-volatile embedded storage technology. Data in MRAM is stored through magnetic storage elements. The magnetic storage element consists of two ferromagnetic plates, each of which can remain magnetized and separated by a thin insulating layer. One of the two plates is a permanent magnet set to a specific polarity, and the magnetization of the other plate can be changed to match the magnetization of an external magnetic field to store data. This configuration is called a magnetic tunnel junction (MTJ) and is the basic structure of MRAM bits.

A metal-insulator-metal (MIM) capacitor is equivalent to a parallel plate capacitor and is generally formed in the back-end metal process stage (BEOL). MIM capacitors are composed of two layers of metal and a capacitor dielectric layer in the middle. MIM capacitors and MRAM embedded memory are used in a variety of devices and systems, including smartphones, embedded systems (such as home appliances and automotive control systems), Internet of Things devices, computer hardware, and communications equipment. They perform a variety of basic functions, from high-frequency signal processing and program/code storage to data storage, control and configuration settings.

SUMMARY OF THE INVENTION

It is one object of the present invention to provide an improved embedded memory device in order to solve the deficiencies or shortcomings of the existing technology.

One aspect of the invention provides an embedded memory device including a substrate having an embedded memory region thereon; a first dielectric layer disposed on the substrate within the embedded memory region; conductive vias embedded in the first dielectric layer; data storage structures respectively disposed on the conductive vias; and spacers respectively surrounding the data storage structures over the first dielectric layer. An outer surface of the spacers and a top surface of the first dielectric layer between the spacers constitute a recessed region. A metal-insulator-metal (MIM) capacitor structure disposed within the recessed region.

According to some embodiments, the conductive vias are tungsten vias.

According to some embodiments, each of the data storage structures comprises a bottom electrode layer in direct contact with each of the conductive vias, a magnetic tunnel junction (MTJ) stack disposed on the bottom electrode layer, and a top electrode layer disposed on the MTJ stack.

According to some embodiments, the MTJ stack comprises a free layer, a tunnel barrier layer, and a reference layer.

According to some embodiments, the top surface of the first dielectric layer between the spacers is a curved surface.

According to some embodiments, the MIM capacitor structure comprises a bottom capacitor electrode, a capacitor dielectric layer on the bottom capacitor electrode, and a top capacitor electrode on the capacitor dielectric layer.

According to some embodiments, the bottom capacitor electrode and the top capacitor electrode comprise titanium nitride.

According to some embodiments, the MIM capacitor structure has a U-shaped cross-sectional profile.

According to some embodiments, the embedded memory device further includes an insulating oxide layer on a top surface of the MIM capacitor structure.

According to some embodiments, the embedded memory device further includes a second dielectric layer covering the MIM capacitor structure, the spacers, and the data storage structures; memory contacts embedded in the second dielectric layer and electrically connected to the data storage structures, respectively; and a capacitor contact embedded in the second dielectric layer and electrically connected to the MIM capacitor structure.

Another aspect of the invention provides a method for forming an embedded memory device. A substrate having an embedded memory region thereon is provided. A first dielectric layer is formed on the substrate within the embedded memory region. Conductive vias are formed in the first dielectric layer. Data storage structures are formed on the conductive vias, respectively. Spacers are formed to respectively surround the data storage structures over the first dielectric layer. An outer surface of the spacers and a top surface of the first dielectric layer between the spacers constitute a recessed region. A metal-insulator-metal (MIM) capacitor structure is formed within the recessed region.

According to some embodiments, the conductive vias are tungsten vias.

According to some embodiments, each of the data storage structures comprises a bottom electrode layer in direct contact with each of the conductive vias, a magnetic tunnel junction (MTJ) stack disposed on the bottom electrode layer, and a top electrode layer disposed on the MTJ stack. According to some embodiments, the MTJ stack comprises a free layer, a tunnel barrier layer, and a reference layer.

According to some embodiments, the top surface of the first dielectric layer between the spacers is a curved surface.

According to some embodiments, the MIM capacitor structure comprises a bottom capacitor electrode, a capacitor dielectric layer on the bottom capacitor electrode, and a top capacitor electrode on the capacitor dielectric layer.

According to some embodiments, the bottom capacitor electrode and the top capacitor electrode comprise titanium nitride.

According to some embodiments, the MIM capacitor structure has a U-shaped cross-sectional profile.

According to some embodiments, the method further includes the steps of forming an insulating oxide layer on a top surface of the MIM capacitor structure.

According to some embodiments, the method further includes the steps of forming a second dielectric layer covering the MIM capacitor structure, the spacers, and the data storage structures; forming memory contacts embedded in the second dielectric layer and electrically connected to the data storage structures, respectively; and forming a capacitor contact embedded in the second dielectric layer and electrically connected to the MIM capacitor structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
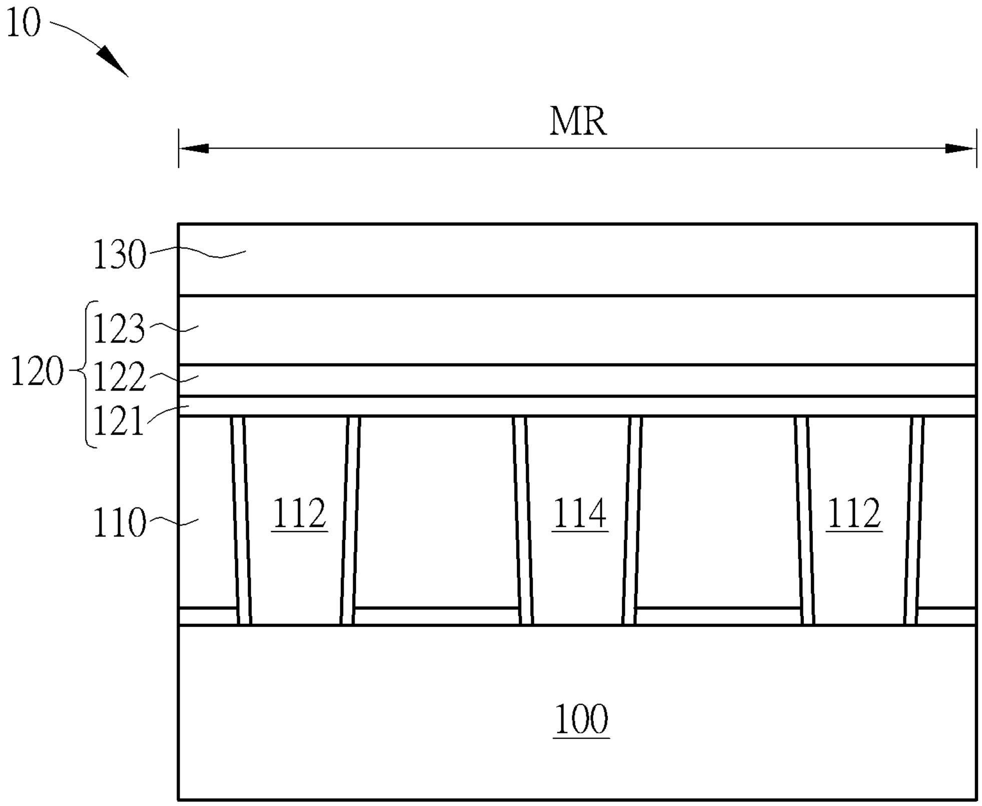
FIG. 1 to FIG. 7 are schematic diagrams showing an exemplary method of forming an embedded memory device according to an embodiment of the present invention.

Please refer to FIG. 1 to FIG. 7, which are schematic diagrams of a method of forming an embedded memory device 10 according to an embodiment of the present invention. As shown in FIG. 1, a substrate 100 is first provided. For example, the substrate 100 may be a silicon substrate, but is not limited thereto. According to an embodiment of the present invention, an embedded memory region MR may be included on the substrate 100. Subsequently, a first dielectric layer 110 is formed on the substrate 100 in the embedded memory region MR. A plurality of conductive vias 112 is then formed in the first dielectric layer 110. According to an embodiment of the present invention, for example, the plurality of conductive vias 112 may be tungsten vias, but not limited thereto. According to an embodiment of the present invention, a conductive via 114 is formed between the conductive vias 112 for electrically connecting a metal-insulator-metal (MIM) capacitor formed in a later stage.

A chemical vapor deposition (CVD) process is then performed to form a memory stack 120 on the first dielectric layer 110 and the conductive via 112, including but not limited to a bottom electrode layer 121, a magnetic tunnel junction (MTJ) stack 122 on the bottom electrode layer 121, and a top electrode layer 123 on the MTJ stack 122. According to an embodiment of the present invention, for example, the bottom electrode layer 121 may include tantalum (Ta), platinum (Pt), copper (Cu), gold (Au) or aluminum (Al), but is not limited thereto. According to an embodiment of the present invention, for example, the top electrode layer 123 may include ruthenium (Ru) or tantalum (Ta), but is not limited thereto.

According to an embodiment of the present invention, the MTJ stack 122 may include, but is not limited to, a free layer, a tunnel barrier layer, and a reference layer. According to an embodiment of the present invention, the reference layer and the free layer may be made of ferromagnetic materials, and the tunnel barrier layer may be made of insulating materials, but are not limited thereto. Subsequently, a capping layer 130, such as a silicon oxide layer, is deposited on the memory stack 120.

Figure 2:
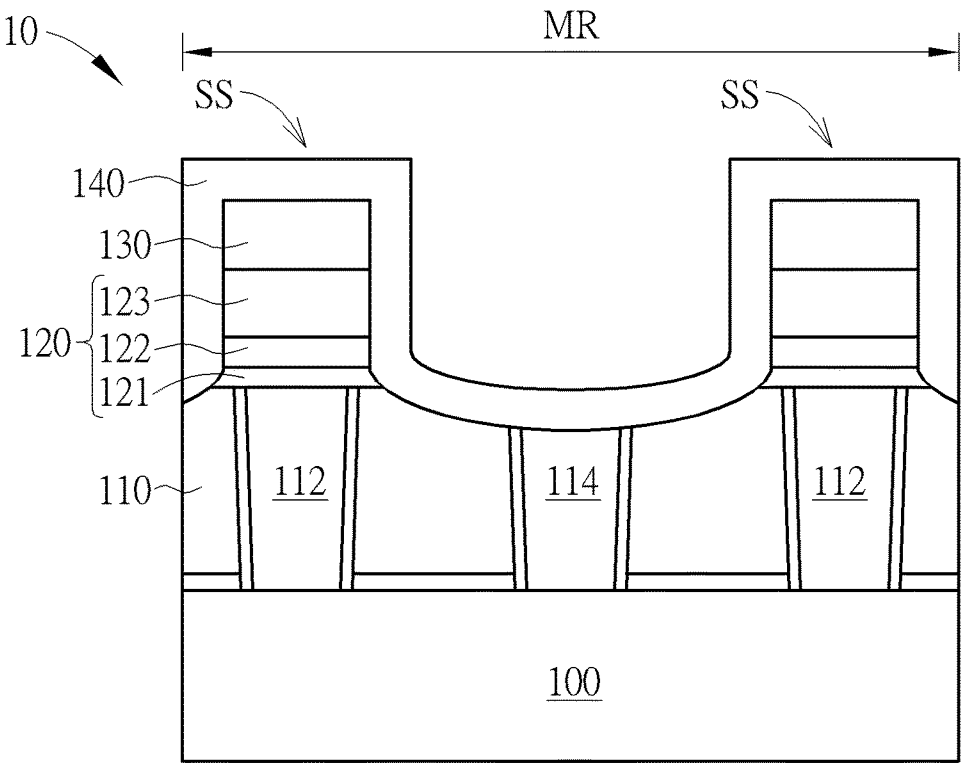

As shown in FIG. 2, an ion beam etching (IBE) process is then performed to etch away part of the capping layer 130, the MTJ stack 122 and the first dielectric layer 110, thereby forming a plurality of column-shaped data storage structures SS on the conductive vias 112 respectively. The data storage structure SS is substantially aligned with the conductive via 112. According to an embodiment of the present invention, the data storage structure SS includes the bottom electrode layer 121 in direct contact with the conductive via 112, the MTJ stack 122 disposed on the bottom electrode layer 121, the top electrode layer 123 disposed on the MTJ stack 122, and the capping layer 130 on the top electrode layer 123.

Subsequently, a chemical vapor deposition (CVD) process is performed to deposit a spacer layer 140, such as a silicon nitride layer, on the substrate 100 in a blanket manner. According to an embodiment of the present invention, the spacer layer 140 conformally covers the data storage structures SS and the exposed first dielectric layer 110 and the conductive via 114.

Figure 3:
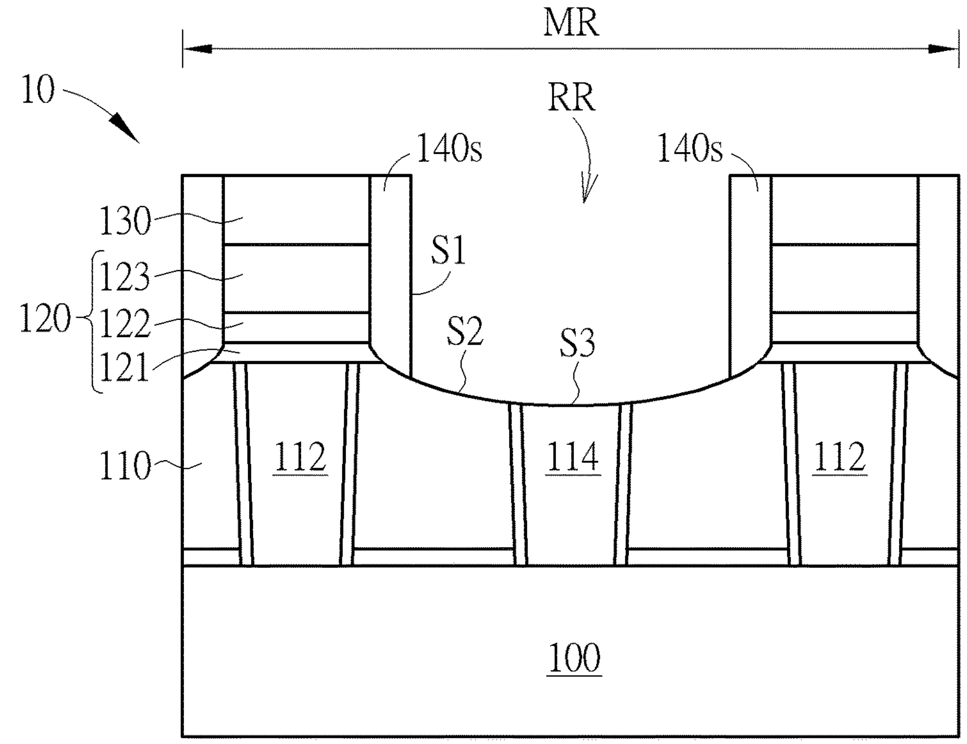

As shown in FIG. 3, an anisotropic dry etching process is then performed to etch the spacer layer 140 to form a plurality of spacers **140*s* respectively surrounding the plurality of data storage structures SS on the first dielectric layer 110. The spacers 140*s* can protect the sidewalls of the data storage structures SS. According to an embodiment of the present invention, the outer surfaces S1 of the plurality of spacers 140*s*, the top surface S2 of the first dielectric layer 110 and the top surface S3 of the conductive via 114 between the spacers 140*s* form a recessed region RR. According to an embodiment of the present invention, the top surface S2 of the first dielectric layer 110 between the spacers 140*s*** may be a curved surface.

Figure 4:
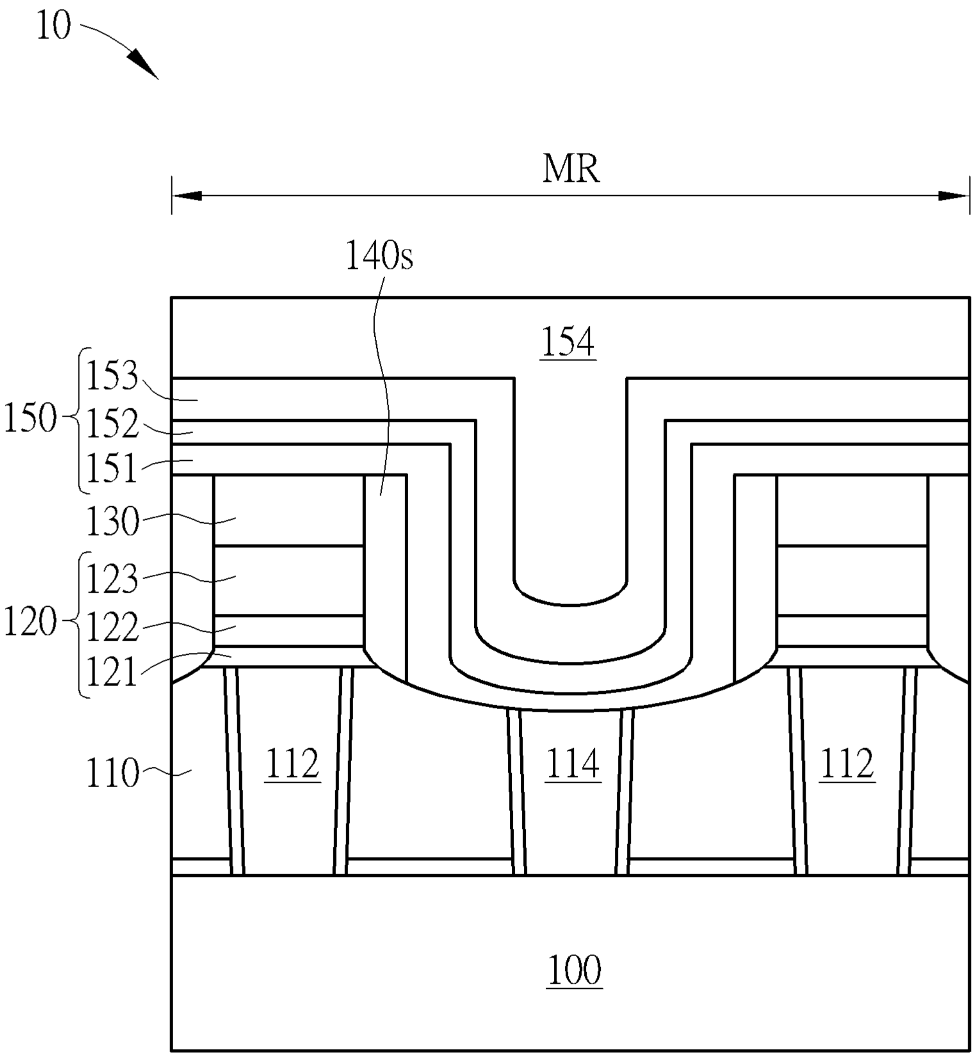

As shown in FIG. 4, a chemical vapor deposition process, such as an atomic layer deposition (ALD) process, is then performed to deposit a metal-insulator-metal (MIM) stack 150 and a planarization layer 154 on the substrate 100 in a blanket manner. The MIM stack 150 and the planarization layer 154 completely fill the recessed region RR. According to an embodiment of the present invention, the MIM stack 150 includes a bottom capacitor electrode 151, a capacitor dielectric layer 152 on the bottom capacitor electrode 151, and a top capacitor electrode 153 on the capacitor dielectric layer 152. According to an embodiment of the present invention, the bottom capacitor electrode 151 directly contacts the conductive via 114.

According to an embodiment of the present invention, the bottom capacitor electrode 151 and the top capacitor electrode 153 may include titanium nitride, but are not limited thereto. According to an embodiment of the present invention, the capacitor dielectric layer 152 may include high dielectric constant materials such as aluminum oxide or zirconium oxide, but is not limited thereto. According to an embodiment of the present invention, the MIM stack 150 is conformally deposited in the recessed region RR. Therefore, the MIM stack 150 has a U-shaped cross-sectional profile.

Figure 5:
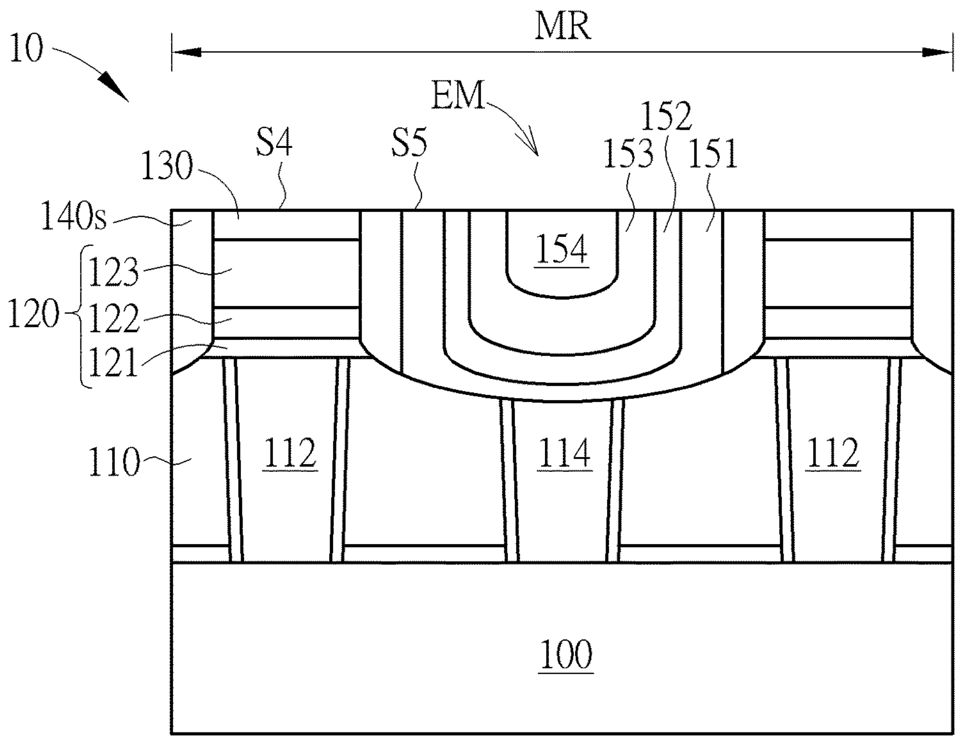

As shown in FIG. 5, a chemical mechanical polishing (CMP) process is then performed to polish away the MIM stack 150 and the planarization layer 154 outside the recessed region RR, thereby forming a MIM capacitor structure EM in the recessed region RR. At this point, the top surface S4 of the capping layer 130 of the data storage structure SS may be exposed, and the top surface S4 of the capping layer 130 is flush with the top surface S5 of the MIM capacitor structure EM.

Figure 6:
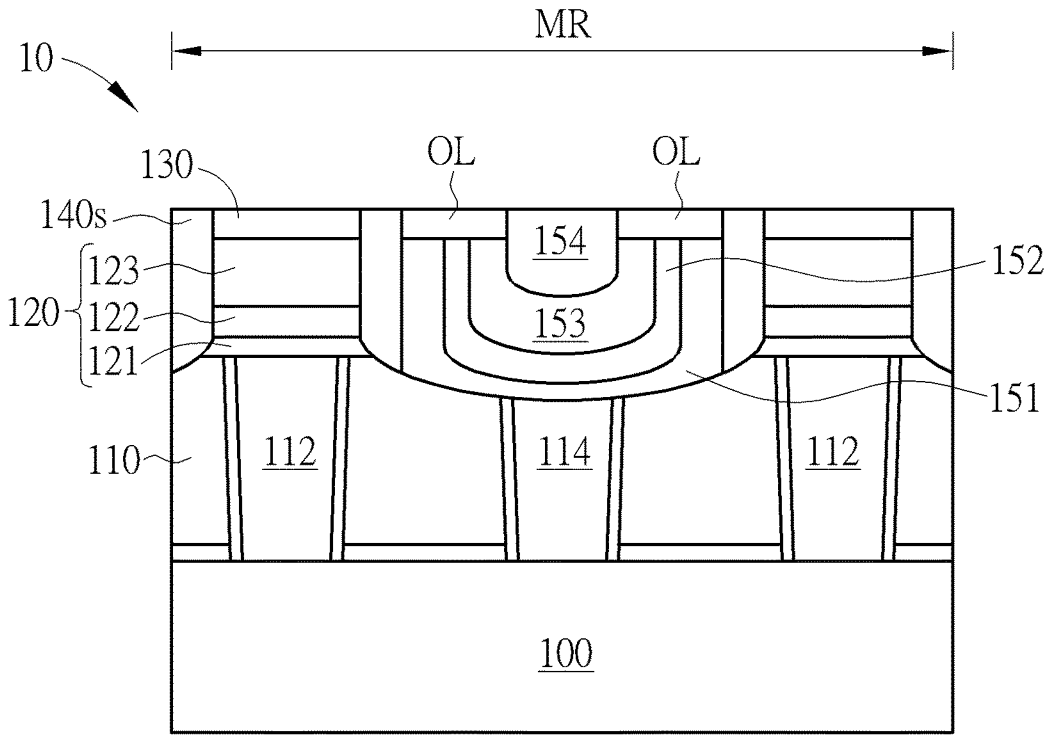

As shown in FIG. 6, an oxidation process is performed to oxidize the exposed top surface S5 of the MIM capacitor structure EM to form an insulating oxide layer OL. According to an embodiment of the present invention, for example, the insulating oxide layer OL may include, but is not limited to, titanium oxynitride or titanium oxide.

Figure 7:
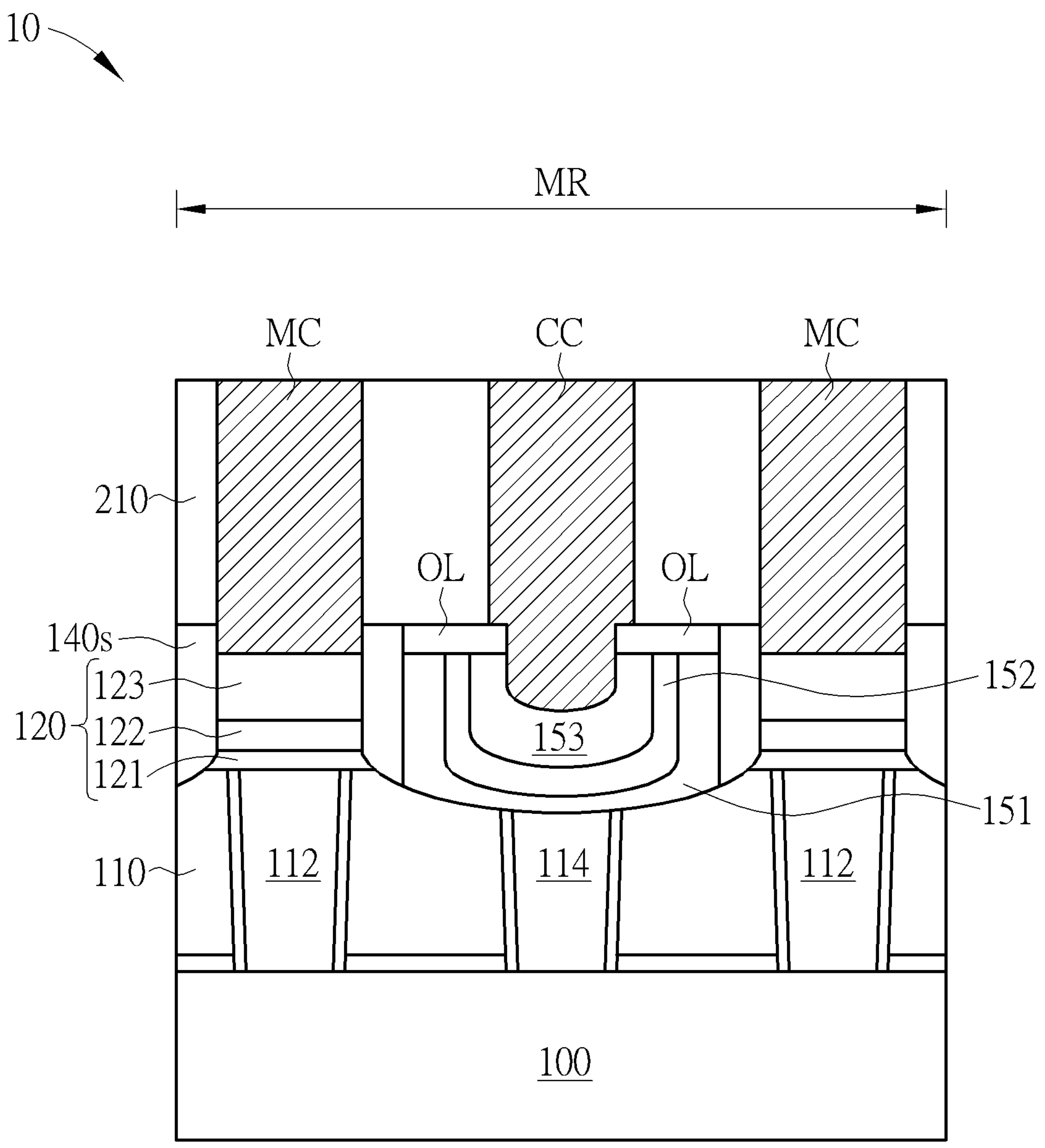

As shown in FIG. 7, a chemical vapor deposition process is then performed to deposit a second dielectric layer 210 on the substrate 100 in a blanket manner. According to an embodiment of the present invention, the second dielectric layer 210 covers the MIM capacitor structure EM, the insulating oxide layer OL, the plurality of spacers 140*s*, and the plurality of data storage structures SS.

Subsequently, a metal interconnection process is performed to form a plurality of memory contacts MC and capacitor contacts CC in the second dielectric layer 210. The memory contacts MC penetrate the second dielectric layer 210 and the capping layer 130 and arc electrically connected to the top electrode layer 123 of the data storage structure SS. The capacitor contact CC penetrates the second dielectric layer 210 and the planarization layer 154 and is electrically connected to the top capacitor electrode 153 of the MIM capacitor structure EM.

Structurally, as shown in FIG. 7, the embedded memory device 10 of the present invention includes a substrate 100 with an embedded memory region MR thereon; a first dielectric layer 110 disposed on the substrate 100 in the embedded memory region MR; a plurality of conductive vias 112 embedded in the first dielectric layer 110; a plurality of data storage structures SS respectively provided on the plurality of conductive vias 112; a plurality of spacers 140*s* respectively surrounding the plurality of data storage structures SS on the first dielectric layer 110, wherein the outer surface S1 of the plurality of spacers 140*s* and the top surface S2 of the first dielectric layer 110 between the plurality of spacers 140*s* constitute a recessed region RR; and a metal-insulator-metal (MIM) capacitor structure EM disposed in the recessed region RR. According to an embodiment of the invention, for example, the plurality of conductive vias 112 are tungsten vias.

According to an embodiment of the present invention, each of the plurality of data storage structures SS includes a bottom electrode layer 121 in direct contact with the respective plurality of conductive vias 112, an MTJ stack 122 disposed on the bottom electrode layer 121, and a top electrode layer 123 disposed on the MTJ stack 122. According to an embodiment of the present invention, the MTJ stack 122 includes, for example, a free layer, a tunnel barrier layer, and a reference layer.

According to an embodiment of the present invention, the top surface S1 of the first dielectric layer 110 between the spacers 140*s* may be a curved surface.

According to an embodiment of the present invention, the MIM capacitor structure EM includes a bottom capacitor electrode 151, a capacitor dielectric layer 152 on the bottom capacitor electrode 151, and a top capacitor electrode 153 on the capacitor dielectric layer 152. According to an embodiment of the present invention, for example, the bottom capacitor electrode 151 and the top capacitor electrode 153 may include titanium nitride. According to an embodiment of the invention, the MIM capacitor structure EM may have a U-shaped cross-sectional profile. According to an embodiment of the present invention, the embedded memory device 10 further includes an insulating oxide layer OL located on the top surface of the MIM capacitor structure EM.

According to an embodiment of the present invention, the embedded memory device 10 further includes: a second dielectric layer 210 covering the MIM capacitor structure EM, the plurality of spacers 140*s*, and the plurality of data storage structures SS.

According to an embodiment of the present invention, the embedded memory device 10 further includes: a plurality of memory contacts MC embedded in the second dielectric layer 210 and electrically connected to the plurality of data storage structures SS respectively; and a capacitor contact CC embedded in the second dielectric layer 210 and electrically connected to the MIM capacitor structure EM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded memory device, comprising:

a substrate having an embedded memory region thereon;

a first dielectric layer disposed on the substrate within the embedded memory region;

a plurality of conductive vias embedded in the first dielectric layer;

a plurality of magnetoresistive random access memory (MRAM) data storage structures respectively disposed on the plurality of conductive vias;

a plurality of spacers respectively surrounding the plurality of MRAM data storage structures over the first dielectric layer, wherein an outer surface of the plurality of spacers and a top surface of the first dielectric layer between the plurality of spacers constitute a recessed region; and a metal-insulator-metal (MIM) capacitor structure disposed within the recessed region.

2. The embedded memory device according to claim 1, wherein the plurality of conductive vias are tungsten vias.

3. The embedded memory device according to claim 1, wherein each of the plurality of MRAM data storage structures comprises a bottom electrode layer in direct contact with each of the plurality of conductive vias, a magnetic tunnel junction (MTJ) stack disposed on the bottom electrode layer, and a top electrode layer disposed on the MTJ stack.

4. The embedded memory device according to claim 3, wherein the MTJ stack comprises a free layer, a tunnel barrier layer, and a reference layer.

5. The embedded memory device according to claim 1, wherein the top surface of the first dielectric layer between the plurality of spacers is a curved surface.

6. The embedded memory device according to claim 1, wherein the MIM capacitor structure comprises a bottom capacitor electrode, a capacitor dielectric layer on the bottom capacitor electrode, and a top capacitor electrode on the capacitor dielectric layer.

7. The embedded memory device according to claim 6, wherein the bottom capacitor electrode and the top capacitor electrode comprise titanium nitride.

8. The embedded memory device according to claim 1, wherein the MIM capacitor structure has a U-shaped cross-sectional profile.

9. The embedded memory device according to claim 1 further comprising:

an insulating oxide layer on a top surface of the MIM capacitor structure.

10. The embedded memory device according to claim 1 further comprising:

a second dielectric layer covering the MIM capacitor structure, the plurality of spacers, and the plurality of MRAM data storage structures;

a plurality of memory contacts embedded in the second dielectric layer and electrically connected to the plurality of MRAM data storage structures, respectively; and a capacitor contact embedded in the second dielectric layer and electrically connected to the MIM capacitor structure.

11. A method for forming an embedded memory device, comprising:

providing a substrate having an embedded memory region thereon;

forming a first dielectric layer on the substrate within the embedded memory region;

forming a plurality of conductive vias in the first dielectric layer;

forming a plurality of magnetoresistive random access memory (MRAM) data storage structures on the plurality of conductive vias, respectively;

forming a plurality of spacers respectively surrounding the plurality of MRAM data storage structures over the first dielectric layer, wherein an outer surface of the plurality of spacers and a top surface of the first dielectric layer between the plurality of spacers constitute a recessed region; and forming a metal-insulator-metal (MIM) capacitor structure within the recessed region.

12. The method according to claim 11, wherein the plurality of conductive vias are tungsten vias.

13. The method according to claim 11, wherein each of the plurality of MRAM data storage structures comprises a bottom electrode layer in direct contact with each of the plurality of conductive vias, a magnetic tunnel junction (MTJ) stack disposed on the bottom electrode layer, and a top electrode layer disposed on the MTJ stack.

14. The method according to claim 13, wherein the MTJ stack comprises a free layer, a tunnel barrier layer, and a reference layer.

15. The method according to claim 11, wherein the top surface of the first dielectric layer between the plurality of spacers is a curved surface.

16. The method according to claim 11, wherein the MIM capacitor structure comprises a bottom capacitor electrode, a capacitor dielectric layer on the bottom capacitor electrode, and a top capacitor electrode on the capacitor dielectric layer.

17. The method according to claim 16, wherein the bottom capacitor electrode and the top capacitor electrode comprise titanium nitride.

18. The method according to claim 11, wherein the MIM capacitor structure has a U-shaped cross-sectional profile.

19. The method according to claim 11 further comprising:

forming an insulating oxide layer on a top surface of the MIM capacitor structure.

20. The method according to claim 11 further comprising:

forming a second dielectric layer covering the MIM capacitor structure, the plurality of spacers, and the plurality of MRAM data storage structures;

forming a plurality of memory contacts embedded in the second dielectric layer and electrically connected to the plurality of MRAM data storage structures, respectively; and forming a capacitor contact embedded in the second dielectric layer and electrically connected to the MIM capacitor structure.

* * * * *